NONRECIPROCAL PARAMETRIC AMPLIFIER

Filed Nov. 22, 1963 2 Sheets-Sheet 1

INVENTOR
H. SEIDEL
BY
Sylvan Sherman
ATTORNEY 3,218,564
NONRECIPROCAL PARAMETRIC AMPLIFIER
Harold Seidel, Fanwood, N.J., assignor to Bell Telephone Laboratories, Incorporated, New York, N.Y., a corporation of New York
Filed Nov. 22, 1963, Ser. No. 325,663
10 Claims. (Cl. 330—4.8)

This invention relates to electromagnetic wave amplifiers and, more particularly, to nonreciprocal parametric amplifiers.

Solid state parametric amplifiers, such as, for example, those utilizing varactor diodes as the variable reactance, are well know in the art, and have proven to be highly useful due to their properties of high gain, low noise, and relative simplicity and reliability. These amplifiers, however, are reciprocal devices and, hence, are inherently unstable due to their ability to amplify signals introduced from either the input or output terminals. Thus, wave energy reflected from the load is amplified to the same extent as the input wave energy. The net result is that the amplifier has a tendency to oscillate.

Heretofore, it has been the practice to insert a nonreciprocal component, such as an isolator or circulator, between the amplifier and the load and thereby to prevent reflected wave energy from reaching the amplifier. While such arrangements have generally operated successfully, they have the disadvantage of adding materially to the cost and complexity of the system.

In accordance with the present invention, the desired nonreciprocity in parametric amplifiers is built directly into the amplifier by selectively absorbing or reflecting the appropriate sideband frequencies generated by the amplifier.

As can be shown by the Manley-Rowe relationships, if power in a parametric device is absorbed at the upper sideband frequency, the parametric device appears as a positive resistance at the signal frequency and absorbs power at the signal frequency. On the other hand, if power is absorbed at the lower sideband frequency, the parametric device appears as a negative resistance at the signal frequency and amplifies wave energy at the signal frequency. In accordance with the invention, means are provided for absorbing power at the lower sideband frequency for signal energy propagating in the forward direction, and for absorbing power at the upper sideband frequency for signal energy propagating in the reverse direction.

In one illustrative embodiment of the invention employing the principles described above, a pair of 3 db quadrature hydrids are utilized in connection with a pair of variable reactances. More specifically, one pair of conjugate branches of one of the hybrids is connected to a pair of conjugate branches of the second hybrid. A variable reactance and an associated pumping source are coupled to each interconnected pair of branches.

Each of the second pair of conjugate branches of the second hybrid is terminated in a pair of circuits. The circuits of one of these branches are reactively terminated at both the upper and lower sideband frequencies while the circuits of the other branch are resistively terminated at both the upper and lower sideband frequencies. The remaining pair of conjugate branches of the first hybrid constitute the input and output terminals of a nonreciprocal parametric amplifier.

Additional illustrative embodiments of the invention using other types of hybrids are also disclosed.

These and other objects and advantages, the nature of the present invention, and its various features, will appear more fully upon consideration of the various illustrative embodiments now to be described in detail in connection with the accompanying drawings in which.

Figures 1, 2:
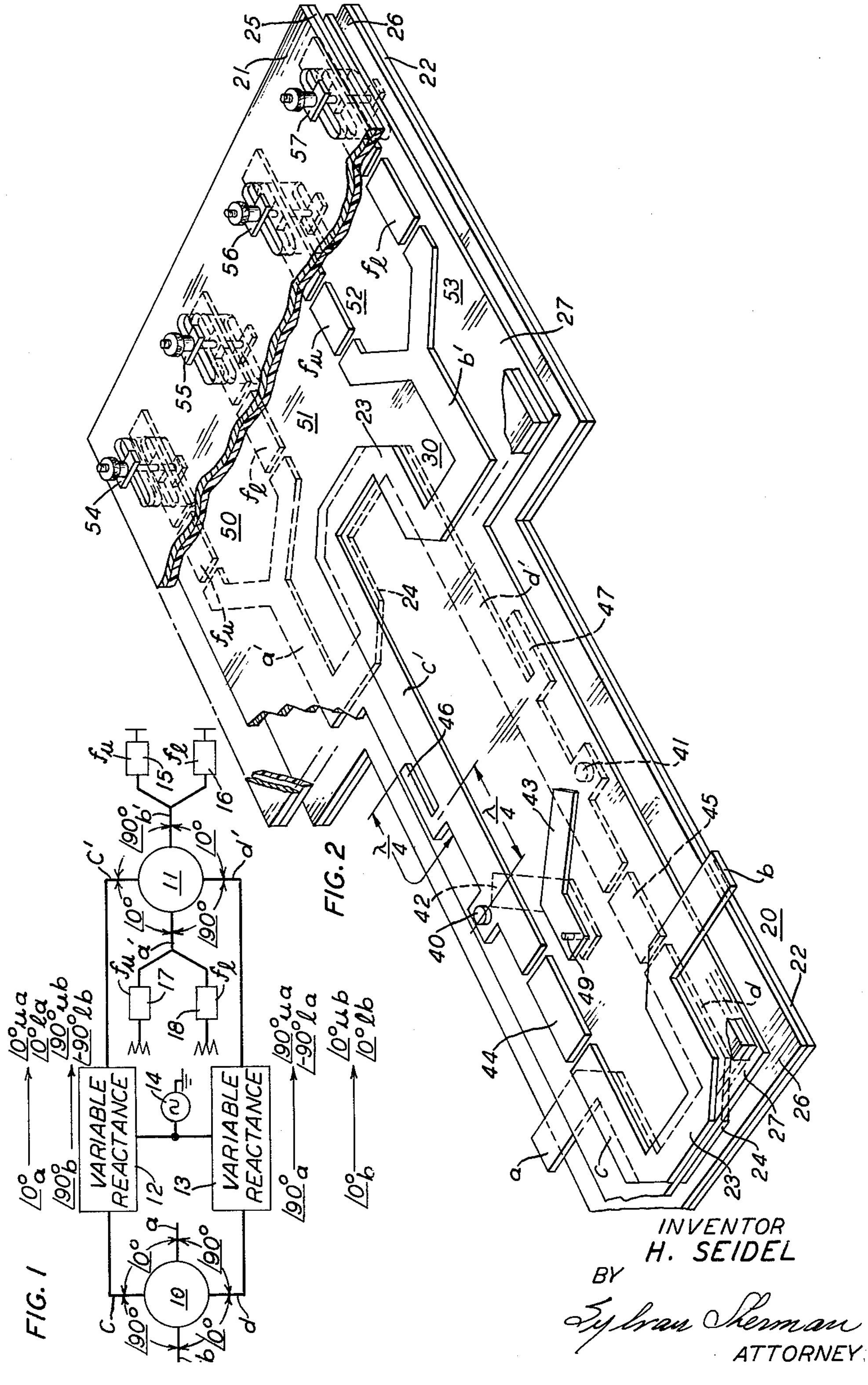
FIG. 1 shows, in block diagram, a nonreciprocal parametric amplifier in accordance with the invention using quadrature power dividing network.
FIG. 2 is an illustrative embodiment of the amplifier of FIG. 1 using strip transmission lines.

Referring to FIG. 1, there is illustrated, in block diagram, a nonreciprocal parametric amplifier in accordance with the invention. The particular amplifier illustrated comprises a pair of 3 db quadrature hybrids 10 and 11, each of which has two pairs of conjugate branches. The pairs of conjugate branches associated with hydrid 10 are designated *a–b*, and *c–d*. The pairs of conjugate branches associated with hybrid 11 are designated *a′–b′* and *c′–d′*.

The term "3 db quadrature hybrid" refers to that class of power dividing networks in which the power of the incident signal, applied to one branch of one pair of conjugate branches, divides equally between the other pair of conjugate branches and wherein the relative phases of the divided signals differ by 90 degrees. This includes a large variety of power dividing networks among which are the Riblet coupler (H. J. Riblet, "The Short-Slot Hybrid Junction," Proceedings of the Institute of Radio Engineers, vol. 40, No. 2, February 1952, pages 180–184), the multihole directional coupler (S. E. Miller, "Coupled Wave Theory and Waveguide Applications," Bell System Technical Journal, vol. 33, May 1954, pages 661 to 719), the semi-optical directional coupler (E. A. J. Marcatili, "A Circular Electric Hybrid Junction and Some Channel-Dropping Filters," Bell System Technical Journal, vol. 40, January 1961, pages 185 to 196), and the strip transmission line directional coupler (J. K. Shimizu in an article entitled "Strip-Line 3 db Directional Couplers," published in the 1957 Institute of Radio Engineers Wescon Convention Record, vol. 1, Part 1, pages 4 to 15).

In each of the above-mentioned power dividing networks there is a 90 degree relative phase shift between the output wave components. This is indicated by the $\angle 0°$ and $\angle 90°$ designations between adjacent branches of each of the hybrids 10 and 11.

Referring again to FIG. 1, branch *c* of hybrid 10 is connected to branch *c′* of hybrid 11 by means of a first variable reactance 12. Similarly, branch *d* of hybrid 10 is connected to branch *d′* of hybrid 11 by means of a second variable reactance 13. The variable reactances 12 and 13 can be either variable capacitances, such as are described by E. D. Reed in his article entitled "The Variable-Capacitance Parametric Amplifiers," published in the October 1959 issue of the Bell Laboratories Record, pages 373 to 379, or they can be variable inductances, such as are described by H. Suhl in his article "Proposal for a Ferromagnetic Amplifier in the Microwave Range," published in the April 15, 1957 issue of the Physical Review at page 384.

Whichever are used, a pumping source 14 supplies pumping energy to the reactances 12 and 13 in a manner consistent with the requirements of the particular reactive device employed.

When signal energy at a frequency $f_s$ is applied to a variable reactance along with the pumping energy at frequency $f_p$, energy components at an upper sideband frequency $f_u=f_p+f_s$ and at a lower sideband $f_l=f_p-f_s$ are produced. Typically, in a parametric amplifier the upper sideband is suppressed because it is known that if power is absorbed at the upper sideband the parametric device will also absorb power at the signal frequency. On the other hand, means are provided for absorbing power at the lower sideband, it being known that by so doing the parametric device will then amplify at the signal frequency. Thus, in accordance with the invention, the upper and lower sidebands are selectively absorbed or suppressed as a function of the direction of signal propagation. This is done by means of the four circuits 15, 16, 17 and 18 connected to branches *a'* and *b'* of hybrid 11. Of these, circuits 15 and 17 are tuned to the upper sideband frequency, whereas circuits 16 and 18 are tuned to the lower sideband frequency. This is indicated by the designation $f_u$ or $f_l$ adjacent to the respective circuits. In addition, circuits 15 and 16, connected to branch *b'* are reactively terminated whereas circuits 17 and 18, connected to branch *a'*, are resistively terminated. By the term "reactively terminated," it is meant that the termination is such that the amplifier as a whole appears reactive at a particular frequency. Similarly, the term "resistively terminated" means that the amplifier as a whole appears resistive at a particular frequency. In practice, each of the circuits 15, 16, 17 and 18 is terminated by means of a nondissipative member and the lower sideband energy is absorbed in the reactances 12 and 13. The position of each member is adjusted to produce the termination sought.

Suitable filters for confining energy at the signal frequency and at the pumping frequency to specific portions of the amplifier of FIG. 1 are provided in a manner well known in the art. However, these details have been omitted from the diagram of FIG. 1 in order not to unduly clutter the figure.

In operation, a signal applied to branch *a* of hybrid 10 divides equally between branches *c* and *d* with the portion of signal in branch *d* undergoing a 90 degree phase shift with respect to the portion of signal in branch *c*. This relative phase between signal components is indicated by the $\angle 0°_a$ and $\angle 90°_a$ designations adjacent to the two respective branches. (The subscript *a* indicates that the phase designation is for a signal applied at branch *a*.) These two signal components interact with the pumping energy in reactances 12 and 13 to produce upper and lower sideband components. The relative phases of these components are a function of the relative phases of the signal and the pumping waves. Specifically, the phase $\phi_u$ of the upper sideband is equal to the sum of the phases of the pumping and signal waves, whereas the phase $\phi_l$ of the lower sideband is equal to the difference between the pumping and signal waves. That is $$\phi_u = \phi_p + \phi_s \quad (1)$$

$$\phi_l = \phi_p - \phi_s \quad (2)$$

Assuming $\phi_p$ to be equal to zero, the sideband phases in branch *c'* are $$\phi_u = \angle 0°_p + \angle 0°_a = \angle 0°_{ua}$$

$$\phi_l = \angle 0°_p - \angle 0°_a = \angle 0°_{la}$$

The sideband phases in branch *d'* are $$\phi_u = \angle 0°_p + \angle 90°_a = \angle 90°_{ua}$$

$$\phi_l = \angle 0°_p - \angle 90°_a = \angle -90°_{la}$$

These phase designations are indicated adjacent to the appropriate branches in FIG. 1.

The upper sideband component in branch *c'* enters hybrid 11 with phase $\angle 0°_{ua}$. The upper sideband component in branch *d'* enters hybrid 11 with phase $\angle 90°_{ua}$. These components are combined in branch *b'* and enter circuit 15, which is tuned to the upper sideband frequency $f_u$. This circuit is reactively terminated and hence, no power is absorbed in the amplifier at the upper sideband frequency.

The lower sideband component in branch *c'* enters hybrid 11 with phase $\angle 0°_l$. The lower sideband component in branch *d'* enters hybrid 11 with phase $\angle -90°_l$.

These components are combined in branch *a'* and enter circuit 18, which is tuned to the lower sideband frequency $f_l$. This circuit is resistively terminated and, hence, power is absorbed at the lower sideband frequency.

In the discussion above, it was indicated that the absorption of power at the lower sideband causes a parametric device to appear as a negative resistance at the signal frequency. Accordingly, the signal components applied to variable reactances 12 and 13 sees a negative resistance and are amplified. The amplified signals recombine in, and leave by way of, branch *b* of hybrid 10. Thus, for signal propagation from *a* to *b*, the network of FIG. 1 functions as an amplifier.

If now a signal is applied to branch *b* of hybrid 10, a distinctly different set of phase relations obtains. In this latter case, the signal component in branch *c* undergoes a 90 degree phase shift with respect to the signal component in branch *d* and upon interaction with the pumping energy results in a set of sideband components having phase designations $\angle 90°_{ub}$ and $\angle -90°_{lb}$ for branch *c'* and a set having phase designations $\angle 0°_{ub}$ and $\angle 0°_{lb}$ for branch *d'*.

When applied to hybrid 11, the upper sideband components are combined in branch *a'* and enter circuit $f_u$, which is resistively terminated. The lower sideband components are combined in branch *b'* and enter circuit 16, which is reactively terminated.

Thus, it is seen that the situation is materially different when signal energy is applied to branch *b*. In this latter situation, the network of FIG. 1 appears as a positive resistance at the signal frequency, and signal energy is absorbed rather than amplified. The resulting parametric amplifier is, therefore, nonreciprocal, amplifying in the forward direction of signal propagation from *a* to *b* but attenuating in the reverse direction of signal propagation from *b* to *a*.

FIG. 2 is a specific illustrative embodiment of the invention utilizing strip transmission lines as the transmission media and varactor diodes as the variable reactive elements. It is to be understood, however, that the invention can be practiced using other types of transmission media, such as, conductively bounded waveguides and other types of variable reactances, such as, gyromagnetic elements.

In the embodiment of FIG. 2, two, 3 db strip transmission line directional couplers 20 and 30 of the type described by J. R. Shimizu in the above-mentioned article, are used. Each directional coupler comprises an upper conductive ground plane 21, a lower conductive ground plane 22 and a pair of center conductors 23 and 24. The ground planes are separated, in parallel relationship, from the center conductors by means of insulating layers 25, 26. Similarly, the center conductors are, in turn, separated from each other by means of an insulating layer 27. The various layers of insulation are made of any suitable low-loss material.

Each of the couplers 20 and 30 has two pairs of conjugate branches designated *a–b*, and *c–d*, and *a'–b'* and *c'–d'*, respectively.

Located between branches *c* and *d* of coupler 20 and branches *c'* and *d'* of coupler 30, are a pair of varactor diodes 40 and 41. These are shown connected between the center conductors 23 and 24 and the lower ground plane 22. Alternatively, the balanced diode mounting described in the copending application of M. V. Schneider, Serial No. 281,270, filed May 17, 1963, can be used. Diodes 40 and 41 can be any one of a number of types of varactor diodes known in the art which exhibit a variable capacitance as a function of applied voltage. The diodes can be operated with a slight reverse bias or, as shown, they can be operated at zero bias.

A pumping source (not shown) supplies energy to the diodes through capacitive couplers 42 and 43. The source connects to a post 49 which contacts couplers 42 and 43. In this embodiment of the invention the diodes are pumped in phase.

In order to keep pump energy and sideband energy out of the external signal circuit, a pair of pass-band filters 44 and 45 are inserted between the diodes and coupler 20. Each filter comprises a section of insulated conductor having an electrical length that is equal to an integral multiple of half a wavelength at the signal frequency.

Similarly, to keep the signal energy out of the sideband circuits, band rejection filters 46 and 47 are inserted between the diodes and coupler 30.

Each of the rejection filters 46 and 47 comprises a quarter wavelength, open-ended stub located a quarter wavelength from diodes 40 and 41, respectively.

Connected to branches *a'* and *b'* are the sideband circuits 50, 51, 52 and 53, each of which is terminated by means of one of the shorting members 54, 55, 56 or 57.

Referring to branch *a'*, circuit 50 includes a pass-band filter tuned to the upper sideband frequency $f_u$. Circuit 51 includes a pass-band filter tuned to the lower sideband frequency $f_l$.

As indicated in FIG. 1, the circuits in branch *a'* are resistively terminated. These terminations can be made using dissipative members. However, the use of dissipative members introduces additional noise into the amplifier. Hence, suitably adjusted nondissipative terminations are preferred with the lower sideband power being absorbed by the diodes.

Similarly, circuits 52 and 53 of branch *b'* are tuned to the upper and lower sidebands, respectively. Since these circuits are reactively terminated, the nondissipative shorting means 56 and 57 are provided.

The amplifier of FIG. 2 is adjusted, in accordance with the invention, to provide maximum gain in the *a–b* direction of signal propagation and maximum attenuation in the *b–a* direction of propagation. This is done by adjusting the positions of terminating members 54 and 57 for maximum gain in the *a–b* direction and adjusting the positions of terminating members 55 and 56 for maximum attenuation on the *b–a* direction. It is understood that once the positions of the circuit terminations are determined, these positions can be fixed and the terminations no longer made adjustable. Typically, amplifiers designed to operate at a preselected frequency can be made with fixed terminations.

While the filters shown in FIG. 2 comprise lengths of insulated line, or open-ended stubs, it is understood that these are merely illustrative and that other types of filters known in the art can be used. Furthermore, additional filters may be used, if required, to confine the various frequency components to specific portions of the amplifier network.

Figure 3:
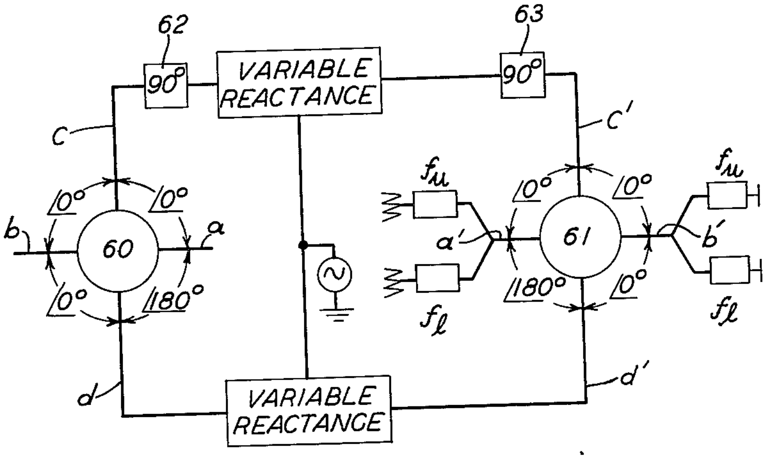
FIG. 3 is a second embodiment of the invention using 180 degree power dividing elements.

The amplifiers illustrated in FIGS. 1 and 2 utilize the so-called "quadrature" hybrids as the power dividing elements. The invention, however, is not limited to this type of power dividing element. Alternatively, the so-called "rat race bridge" and "magic-T" class of hybrids, in which the output signal components are either in phase or 180 degrees out of phase, can be used in conjunction with a 90 degree delay network as illustrated in the block diagram of FIG. 3. Basically, the circuit is the same as that of FIG. 1 except for the hybrids 60 and 61 and delay networks 62 and 63. The delay networks are placed in one of the interconnected branches of each hybrid. Network 62, shown in branch *c*, could alternatively be placed in branch *d*. Similarly, network 63, shown in branch *c'*, could be placed in branch *d'*. Precisely the same analysis of the operation of this amplifier can be made to show that the device produces nonreciprocal transmission effects.

Figure 4:
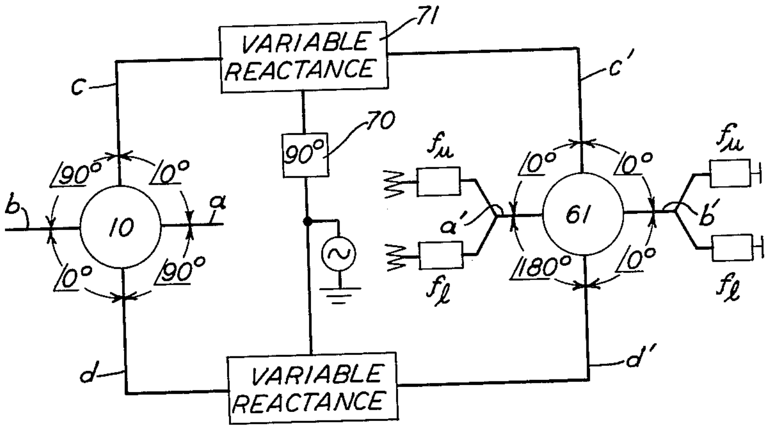
FIG. 4 is a third embodiment of the invention using a combination of different power dividing networks.

A further variation is illustrated in FIG. 4, which combines a quadrature hybrid 10 with a 180 degree hybrid 61. In this embodiment, however, the pumping power is applied to the variable reactances 90 degrees out of phase as indicated by the 90 degree delay network 70 inserted in the pumping circuit to variable reactance 71.

It should also again be emphasized that the invention can be practiced using waveguides, and other forms of transmission media as well as strip transmission lines.

Thus, it is understood that the above-described arrangements are illustrative of a small number of the many possible specific embodiments which can represent application of the principles of the invention. Numerous and varied other arrangements can readily be devised in accordance with these principles by those skilled in the art without departing from the spirit and scope of the invention.

What is claimed is:

1. A nonreciprocal parametric amplifier comprising:
a pair of 3 db hybrids each having two pairs of conjugate branches;
means for connecting one pair of conjugate branches of one of said hybrids to one pair of conjugate branches of the other of said hybrids;
variable reactance means coupled to each of said connecting means;
means for applying pumping power to said reactance means thereby producing upper and lower sideband frequencies;
means for reactively terminating one branch of the other pair of conjugate branches of one of said hybrids for said sideband frequencies;
and means for resistively terminating the second branch of the other pair of conjugate branches of said one hybrid for said sideband frequencies.

2. The amplifier according to claim 1 wherein said reactance means comprises a diode.

3. The amplifier according to claim 1 wherein said reactance means comprises a magnetically biased element of gyromagnetic material.

4. The amplifier according to claim 1 wherein said hybrid and said connecting means comprise sections of strip transmission line.

5. The amplifier according to claim 1 wherein said hybrids are quadrature hybrids.

6. The amplifier according to claim 1 wherein said hybrids are 180 degree hybrids;
and wherein a 90 degree delay network is located in one of the interconnected branches of each hybrid.

7. The amplifier according to claim 1 wherein one of said hybrids is a quadrature hybrid and the other hybrid is a 180 degree hybrid;
and wherein said pumping power is applied to said reactances 90 degrees out of phase.

8. Parametric means for amplifying wave energy at a signal frequency $f_s$ comprising:
a pair of 3 db directional couplers each of which has first, second, third and fourth branches arranged in conjugate pairs with said first and second branches constituting one conjugate pair and said third and fourth branches constituting a second conjugate pair;
means for connecting the first branch of one of said couplers to the first branch of the other of said couplers;
means for connecting the second branch of said one coupler to the second branch of said other coupler;
a variable reactance electrically coupled to each of said connecting means;
means for applying pumping power to said reactances at a frequency $f_p$ thereby producing an upper sideband frequency $f_u=f_p+f_s$, and a lower sideband frequency $f_l=f_p-f_s$;
a first circuit tuned to said upper sideband frequency coupled to said third branch of said one coupler;
a second circuit tuned to said lower sideband frequency coupled to said third branch of said one coupler;

means for reactively terminating said first and second circuits;

a third circuit tuned to said upper sideband frequency coupled to said fourth branch of said one coupler;

a fourth circuit tuned to said lower sideband frequency coupled to said fourth branch of said one coupler;

and means for resistively terminating said third and fourth circuits.

9. The amplifier according to claim 8 wherein said resistive termination comprises dissipative members.

10. The amplifier according to claim 8 wherein said resistive termination comprises nondissipative members.

No references cited.

ROY LAKE, *Primary Examiner.*